United States Patent
Mostoller et al.

(10) Patent No.: US 9,742,054 B2
(45) Date of Patent: Aug. 22, 2017

(54) ELECTRICAL COMPONENT HOLDER

(71) Applicant: Tyco Electronics Corporation, Berwyn, PA (US)

(72) Inventors: Matthew E. Mostoller, Hummelstown, PA (US); Jeffrey W. Shaffer, Shermansdale, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 158 days.

(21) Appl. No.: 13/927,961

(22) Filed: Jun. 26, 2013

(65) Prior Publication Data
US 2015/0002365 A1    Jan. 1, 2015

(51) Int. Cl.
| | |
|---|---|
| *H01Q 1/22* | (2006.01) |
| *F16B 9/02* | (2006.01) |
| *H05K 3/30* | (2006.01) |
| *H01R 4/02* | (2006.01) |
| *H05K 3/34* | (2006.01) |

(52) U.S. Cl.
CPC .............. *H01Q 1/22* (2013.01); *F16B 9/02* (2013.01); *H01R 4/027* (2013.01); *H05K 3/301* (2013.01); *H05K 3/306* (2013.01); *H05K 3/3447* (2013.01); *H05K 2201/10098* (2013.01); *H05K 2201/10606* (2013.01); *Y10T 403/3906* (2015.01)

(58) Field of Classification Search
CPC ..................................................... H01Q 1/22
USPC ........................................ 343/895, 792, 878
See application file for complete search history.

(56) References Cited

U.S. PATENT DOCUMENTS

| | | | | |
|---|---|---|---|---|
| 3,311,790 A | * | 3/1967 | Vizzier, Sr. .......... | H05K 7/1023 361/705 |
| 5,347,690 A | * | 9/1994 | Mansoor ................ | B60R 19/52 24/294 |
| 5,478,258 A | * | 12/1995 | Wang ..................... | H01R 24/50 439/581 |
| 7,439,934 B2 | * | 10/2008 | Leisten ................. | H01Q 11/08 343/859 |
| 7,639,202 B2 | * | 12/2009 | Takaoka et al. ............. | 343/895 |
| 7,775,446 B2 | * | 8/2010 | Ochi ................ | G06K 19/07732 235/492 |
| 2006/0258190 A1 | | 11/2006 | Chen | |
| 2010/0248502 A1 | | 9/2010 | Miki et al. | |

(Continued)

FOREIGN PATENT DOCUMENTS

EP    2 688 150 A1    1/2014

OTHER PUBLICATIONS

AUSGABE, PFAFF, Select 1520, 1530, 1540. List of Spare Parts, Nov. 3, 2002, 20 pgs, VSM-Group AB, Weingarten, Germany.

(Continued)

*Primary Examiner* — Dameon E Levi
*Assistant Examiner* — Walter Davis (57) ABSTRACT

A holder is provided for holding an electrical component on a circuit board having a lead hole. The holder includes a body having a base for holding the electrical component and a connection member for mounting the body to the circuit board. The base includes a lead opening that is configured to hold a solder lead of the electrical component therein. The connection member extends from the base and is configured to mechanically connect to the circuit board such that the base holds an end of the solder lead of the electrical component within the lead hole of the circuit board.

20 Claims, 11 Drawing Sheets

(56) References Cited

U.S. PATENT DOCUMENTS

2010/0328918 A1* 12/2010 Yang ................ H05K 3/301
  361/783
2012/0315799 A1   12/2012 Szczesny

OTHER PUBLICATIONS

International Search Report, International Application No. PCT/US2014/043819, International Filing Date, Jun. 24, 2014.

* cited by examiner

ELECTRICAL COMPONENT HOLDER

BACKGROUND OF THE INVENTION

The subject matter described and/or illustrated herein relates generally to a holder for an electrical component, and more particularly to a holder for holding an electrical component to a circuit board during a soldering operation.

Antennas are electrical devices that convert electrical power into radio frequency (RF) waves, and vice versa. Antennas are used with RF transmitters and RF receivers for respectively transmitting and receiving RF waves. In transmission, the RF transmitter supplies an oscillating RF electric current to the terminals of the antenna, and the antenna radiates the energy from the current as RF waves. In reception, the antenna intercepts some of the power of an RF wave in order to produce a tiny voltage at the terminals of the antenna, which is applied to the RF receiver.

Some known antennas are mounted to circuit boards. For example, some known antennas include a lead that is received within a hole (e.g., an electrical via and/or thru hole) of the circuit board. The lead is then soldered to the circuit board to electrically connect the antenna to the circuit board. For example, the lead may be soldered to a contact pad positioned on a surface of the circuit board adjacent the hole and/or may be soldered to electrically conductive material of the hole.

It may be difficult to solder the leads of at least some known antennas to the circuit board. For example, an operator may need to hold the antenna during the soldering operation to support the antenna and prevent the lead from falling out of, and/or becoming misaligned within, the hole of the circuit board. But, holding the antenna while the lead is being soldered to the circuit board may make it more difficult for a single operator to complete the soldering operation. For example, the single operator may be required to perform the soldering operation with one hand while holding the antenna with the other hand, which may increase the difficulty and/or time required to mount the antenna to the circuit board and thereby increase manufacturing costs and/or reduce production numbers. Moreover, and for example, soldering the leads of at least some known antennas to circuit boards may require two operators, for example one operator to hold the antenna and another operator to solder the antenna to the circuit board. The use of such a second operator to complete the soldering operation may increase manufacturing costs and/or reduce production numbers.

BRIEF DESCRIPTION OF THE INVENTION

In an embodiment, a holder is provided for holding an electrical component on a circuit board having a lead hole. The holder includes a body having a base for holding the electrical component and a connection member for mounting the body to the circuit board. The base includes a lead opening that is configured to hold a solder lead of the electrical component therein. The connection member extends from the base and is configured to mechanically connect to the circuit board such that the base holds an end of the solder lead of the electrical component within the lead hole of the circuit board.

In an embodiment, an antenna assembly includes an antenna that includes a solder lead having an end. The antenna assembly also includes an antenna holder for holding the antenna on a circuit board. The antenna holder includes a body having a base for holding the antenna and a connection member for mounting the body to the circuit board. The base includes a lead opening. The solder lead of the antenna is received within the lead opening such that the end of the solder lead is exposed from the body for being received within a lead hole of the circuit board. The connection member extends from the base and is configured to mechanically connect to the circuit board such that the base holds the end of the solder lead of the antenna within the lead hole of the circuit board.

In an embodiment, a circuit board assembly includes a circuit board having a lead hole, and an antenna that includes a solder lead having an end. The circuit board assembly also includes an antenna holder for holding the antenna on the circuit board. The antenna holder includes a body having a base for holding the antenna and a connection member for mounting the body to the circuit board. The base includes a lead opening. The solder lead of the antenna is received within the lead opening such that the end of the solder lead is exposed from the body. The connection member extends from the base and is mechanically connected to the circuit board such that the base holds the end of the solder lead of the antenna within the lead hole of the circuit board.

DETAILED DESCRIPTION OF THE INVENTION

Figure 1:
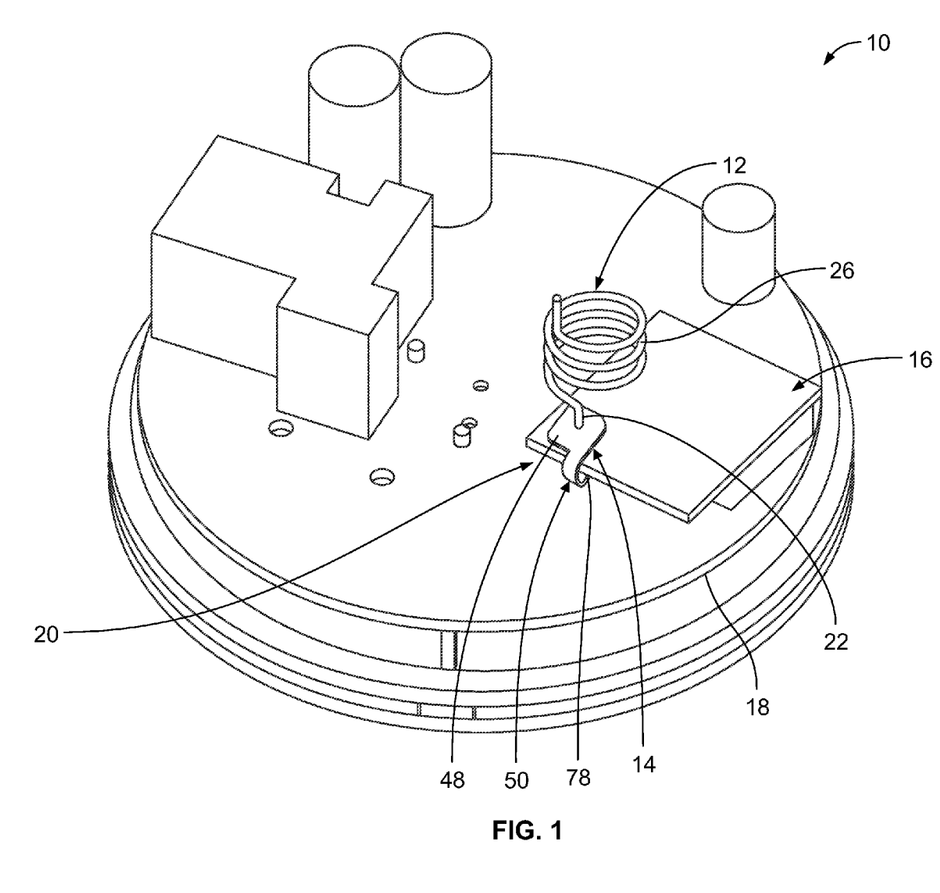
FIG. 1 is a perspective view of an embodiment of an electrical device.

FIG. 1 is a perspective view of an embodiment of an electrical device. The electrical device 10 includes an electrical component 12, a holder 14, and a circuit board 16. In the illustrated embodiment, the electrical component 12 is an antenna. The electrical component 12 will be referred to herein as the "antenna 12", while the holder 14 will be referred to herein as the "antenna holder 14". As will be described in more detail below, the antenna 12 and the antenna holder 14 are mounted to the circuit board 16. As can be seen in FIG. 1, the circuit board 16 is mounted to a substrate 18 of the electrical device 10. The substrate 18 may be a host circuit board that provides electrical pathways between the circuit board 16 and one or more various other components of the electrical device 10. Alternatively, the substrate 18 may be a structure that mechanically supports the circuit board 16 within the electrical device 10 without providing any electrical pathways between the circuit board 16 and one or more various other components of the electrical device 10. The electrical device 10 may be any type of electrical device that includes an electrical component 12 that is mounted to a circuit board. A combination of the antenna 12 and the antenna holder 14 may be referred to herein as an "antenna assembly".

The circuit board 16, the antenna holder 14, and the antenna define a circuit board assembly 20, which is an antenna system that is configured to transmit and/or receive radio frequency (RF) waves. For example, the circuit board 16 may be, or include, an RF transmitter that transmits RF waves into the environment (e.g., the atmosphere) of the electrical device 10 using the antenna 12. Moreover, the circuit board 16 may be, or include, an RF receiver that receives RF waves from the environment of the electrical device 10 using the antenna 12. In some embodiments, the circuit board 16 is, or includes, both an RF transmitter and an RF receiver for both transmitting RF waves into the environment using the antenna 12 and receiving RF waves from the environment using the antenna 12.

As will be described in more detail below, the antenna holder 14 is configured to hold the antenna 12 to the circuit board 16 during a soldering operation. Specifically, the antenna holder 14 holds a solder lead 22 of the antenna 12 within a lead hole 24 (FIGS. 2, 8, and 10) of the circuit board 16 while the solder lead 22 is soldered to the circuit board 16. As described above, the electrical component 12 is an antenna in the illustrated embodiment. But, the electrical component 12 is not limited to being or including an antenna. Rather, in addition or alternatively to an antenna, the electrical component 12 may be, or include, any other type of electrical component that includes a solder lead (e.g., the solder lead 22) for soldering the electrical component 12 to a circuit board. Examples of other types of electrical components of the electrical component 12 include, but are not limited to, electrical connectors, electrical contacts, capacitors, memories, integrated circuits, processors, controllers, chips, single leaded connector pins, combined thru hole and surface mount components, and/or the like.

Figure 2:
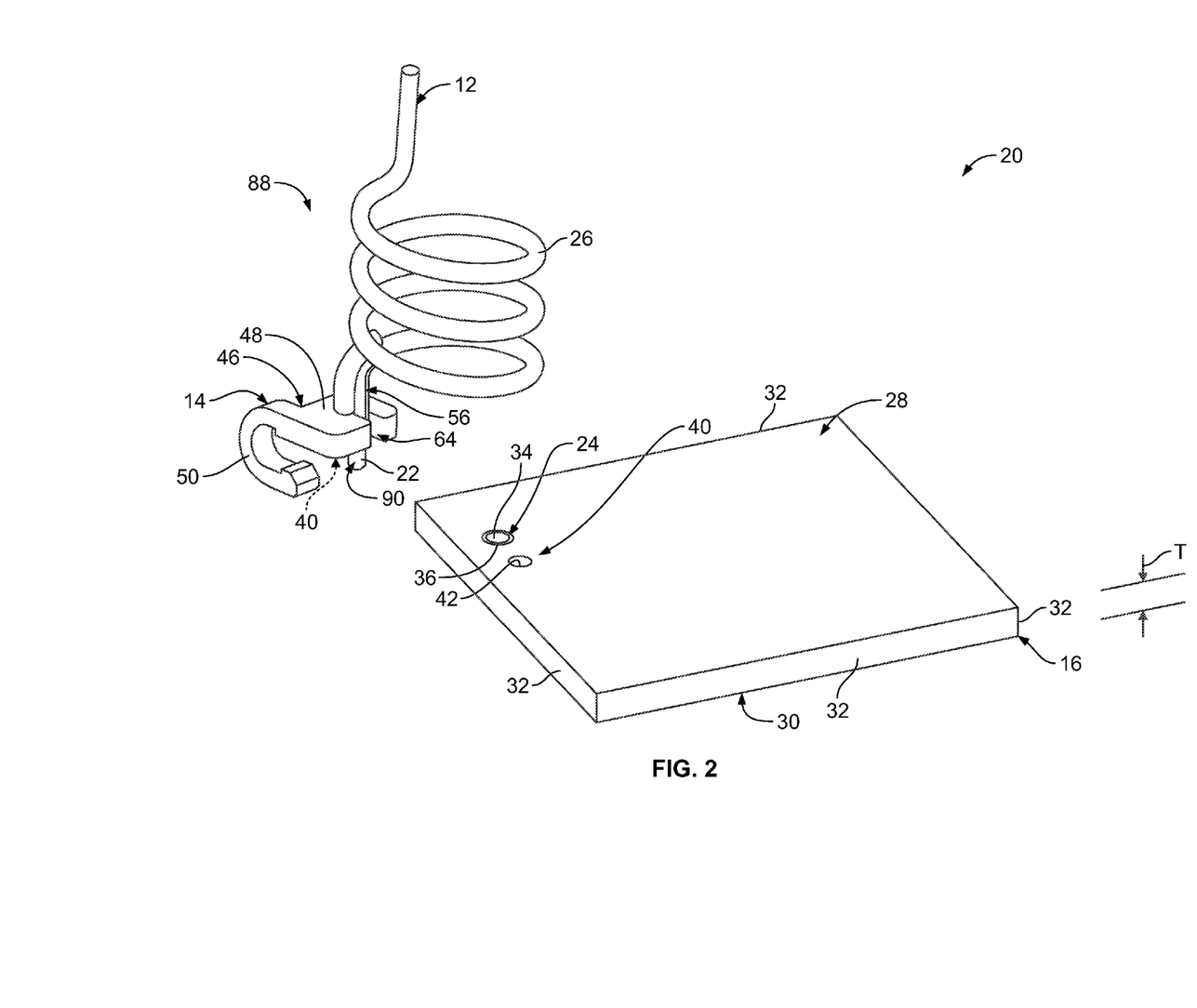
FIG. 2 is a partially exploded perspective view of a circuit board assembly of the electrical device shown in FIG. 1.

FIG. 2 is a partially exploded perspective view of the circuit board assembly 20. The solder lead 22 of the antenna 12 is shown in FIG. 2 as being held by the antenna holder 14, while the antenna 12 and the antenna holder 14 are shown as exploded from the circuit board 16. In the illustrated embodiment, the antenna 12 includes the solder lead 22 and a coil 26 that extends from the solder lead 22. But, the coil 26 is meant only as one example of the shape of the antenna 12. The antenna 12 is not limited to having a coil. Rather, the antenna 12 may be any other type of antenna having any other shape in addition or alternative to the coil 26, such as, but not limited to, fractal shapes, loops, beams, and/or the like.

The circuit board 16 extends a thickness T from an antenna side 28 to an opposite side 30 that is opposite the antenna side 28. The circuit board 16 includes one or more edges 32 that extend from the antenna side 28 to the opposite side 30. The circuit board 16 includes the lead hole 24, which as will be described below is configured to receive the solder lead 22 of the antenna 12 therein. In the illustrated embodiment, the lead hole 24 is a thru hole that extends completely through the thickness T of the circuit board 16. But, the lead hole 24 may extend only partially through the thickness T of the circuit board 16. Moreover, in the illustrated embodiment, the lead hole 24 is an electrical via that includes electrically conductive material 34 that extends on the interior wall(s) of the circuit board 16 that define the lead hole 24. Optionally, the lead hole 24 includes an electrically conductive contact pad 36 that extends on the antenna side 28 and/or includes an electrically conductive contact pad 38 (FIG. 10) that extends on the opposite side 30. As will be described below, the solder lead 22 of the antenna 12 is soldered to the material 34, the contact pad 36, and/or the contact pad 38. The antenna side 28 of the circuit board 16 may be referred to herein as an "electrical component side" of the circuit board 16. The opposite side 30 of the circuit board 16 may be referred to herein as a "side" of the circuit board 16.

In some alternative embodiments, the lead hole 24 is not an electrical via (whether or not the lead hole 24 is a thru hole) such that the lead hole 24 does not include the electrically conductive material 34. In embodiments wherein the lead hole 24 is not an electrical via, the solder lead 22 may be soldered to one or more contact pads and/or other electrical contacts (not shown) that extend on the opposite side 30 of the circuit board 16 adjacent the lead hole 24, and/or the solder lead 22 may be soldered to one or more contact pads and/or other electrical contacts (not shown) that extend on the antenna side 28 adjacent the lead hole 24.

In the illustrated embodiment, the lead hole 24 has a cylindrical (i.e., circular cross-sectional) shape, as is shown in FIG. 2. But, the lead hole 24 may additionally or alternatively include any other shape, such as, but not limited to, a parallelepiped, a rectangular cross-sectional shape, an oval cross-sectional shape, a triangular cross-sectional shape, a cross-sectional shape having more than four sides, and/or the like.

The antenna holder 14 and the circuit board 16 include a detent 40. Specifically, and as will be described in more detail below, the circuit board 16 includes an opening 42 that receives a protrusion 44 (FIGS. 4 and 9) of the antenna holder 14 therein to resist rotation of the antenna holder 14 relative to the circuit board 16. In the illustrated embodiment, opening 42 is a thru hole that extends completely through the thickness T of the circuit board 16. But, the opening 42 may extend only partially through the thickness T of the circuit board 16. For example, the opening 42 may be a depression within the antenna side 28 or the opposite side 30 of the circuit board 16. Moreover, in the illustrated embodiment, the opening 42 has a cylindrical (i.e., circular cross-sectional) shape. But, the opening 42 may additionally or alternatively include any other shape, such as, but not limited to, a parallelepiped, a rectangular cross-sectional shape, an oval cross-sectional shape, a triangular cross-sectional shape, a cross-sectional shape having more than four sides, and/or the like. Examples of shapes of the opening 42 when the opening 42 is a depression include, but are not limited to, a partially spherical (e.g., a half sphere, a ⅓ sphere, a ¼ sphere, and/or the like) depression, a triangular depression, an oval shaped depression, a rectangular depression, a depression having more than four sides, and/or the like.

Although shown as having a rectangular shape that includes four edges 32, the circuit board 16 may additionally or alternatively include any other shape, such as, but not limited to, a circular shape, an oval shape, a triangular shape, a shape having more than four edges 32, and/or the like.

Figure 3:
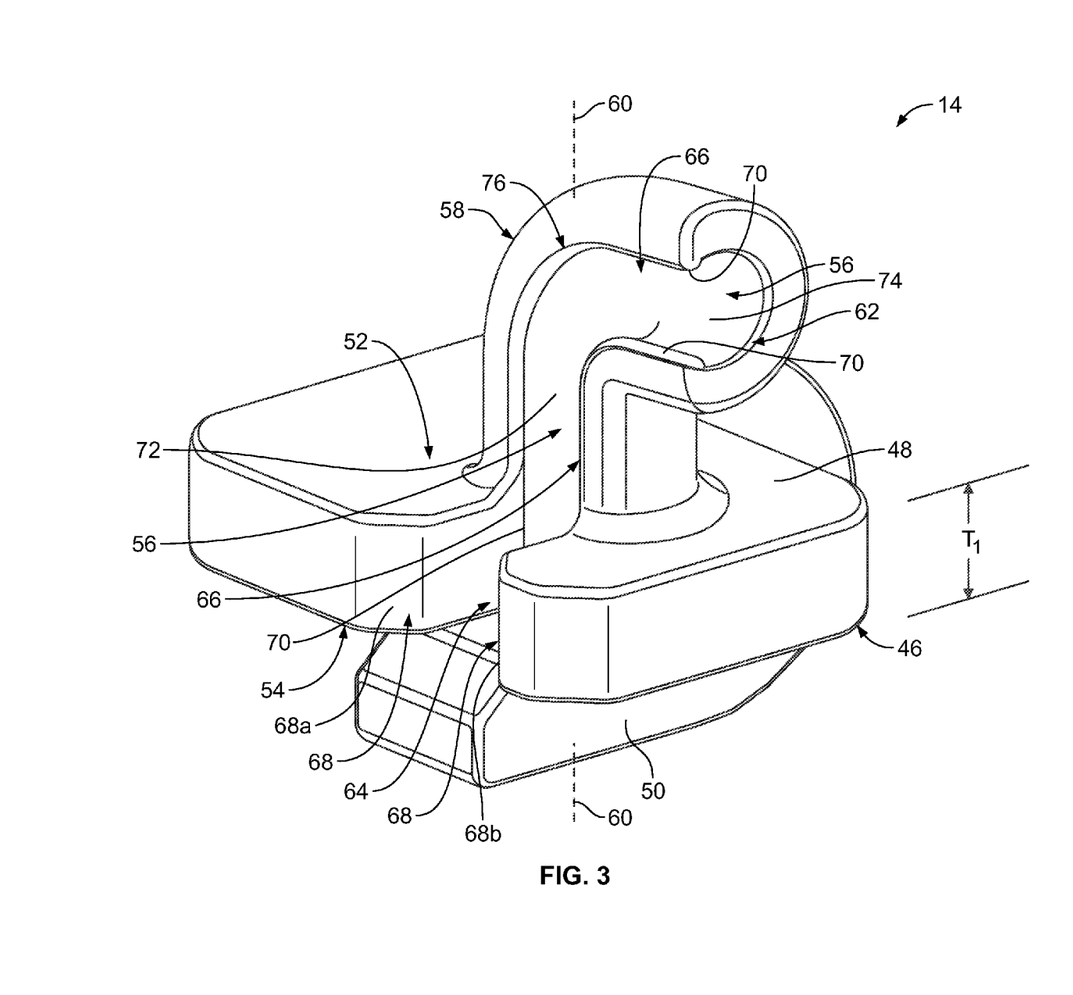
FIG. 3 is a perspective view of an embodiment of an antenna holder of the circuit board assembly shown in FIG. 2.
Figure 4:
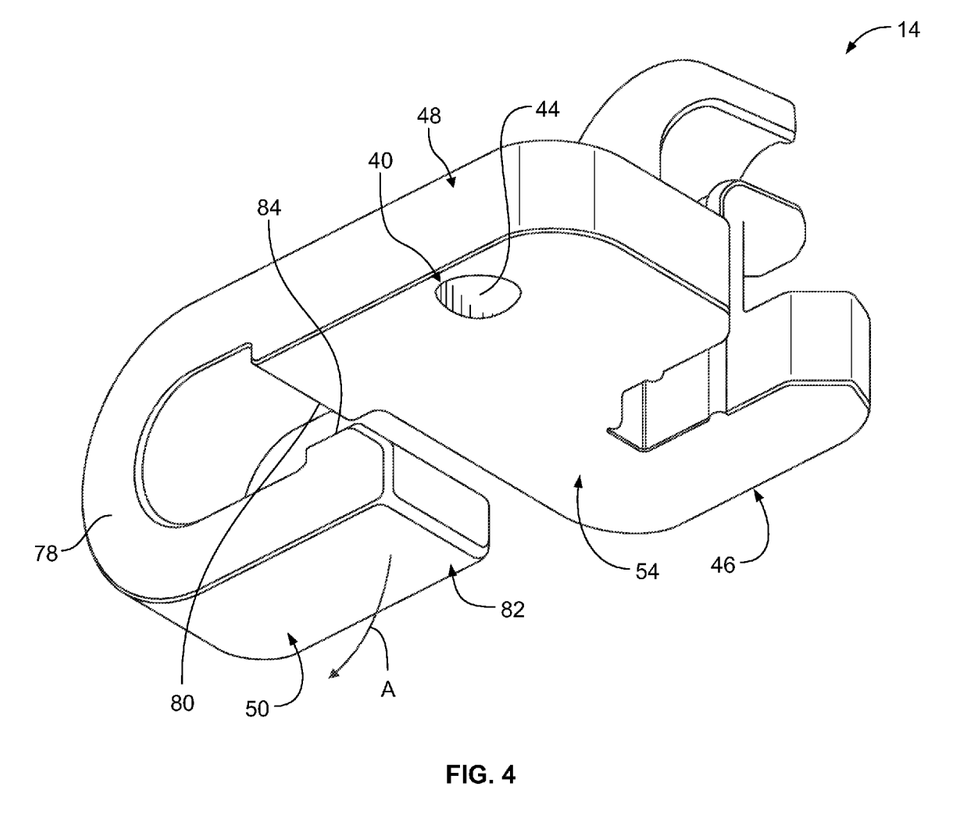
FIG. 4 is another perspective view of the antenna holder shown in FIG. 3 illustrating a different orientation of the antenna holder as compared to FIG. 3.

FIG. 3 is a perspective view of an embodiment of the antenna holder 14. FIG. 4 is another perspective view of the antenna holder 14 illustrating a different orientation of the antenna holder 14 as compared to FIG. 3. Referring now to FIGS. 2-4, the antenna holder 14 includes a body 46 having a base 48 and a connection member 50 that extends from the base 48. As will be described below, the base 48 is configured to hold the antenna 12 (not shown in FIGS. 3 and 4), and the connection member 50 is configured to mount the body 46 to the circuit board 12 (not shown in FIGS. 3 and 4). The body 46 of the antenna holder 14 is fabricated from one or more dielectric materials such that at least a portion of the body 46 is dielectric (i.e., electrically insulative). The dielectric properties of the body 46 enables the body 46 to hold the antenna 12 without electrically shorting the antenna 12. In some embodiments, one or more portions of the body 46 may be metallized and/or electrically conductive, so long as the body 46 does not provide an electrical short between the antenna 12 and the circuit board 16.

Referring now solely to FIG. 3, the base 48 extends a thickness $T_1$ from a side 52 to an opposite side 54. The base 48 includes a lead opening 56 that extends through the thickness $T_1$ of the base 48. The lead opening 56 is configured to hold the solder lead 22 (FIGS. 1, 2, 5-8, and 10) of the antenna 12 (FIGS. 1, 2, and 5-10) therein, as will be described below. Optionally, the base 48 includes a tower 58 that extends outward from the side 52 of the base 48. As can be seen in FIG. 3, the lead opening 56 extends through the tower 58 of the base 48. When included, the tower 58 provides additional support for the antenna 12 along an axis 60 of the base 48 that extends approximately perpendicular to the sides 52 and 54 of the base 48.

The lead opening 56 extends a length through the base 48 from an end 62 to an opposite end 64. As can be seen in FIG. 3, the length of the lead opening 56 extends through the tower 58 of the base 48. The lead opening 56 includes a side entrance 66 that extends along the length of the lead opening 56 from the end 62 to the end 64. As will be described below, the lead opening 56 is configured to receive the solder lead 22 of the antenna 12 therein through the side entrance 66. In other words, the solder lead 22 is configured to be inserted into the lead opening 56 through the side entrance 66. The base 48 includes an optional lead-in feature 68 for guiding the solder lead 22 into the lead opening 56 through the side entrance 66. In the illustrated embodiment, the lead-in feature 68 includes opposing ramps 68a and 68b, but other structures may be additionally or alternatively used as the lead-in feature 68.

In the illustrated embodiment, the lead opening 56 of the base 48 is configured to receive the solder lead 22 of the antenna 12 with a snap-fit connection to hold the solder lead 22 within the lead opening 56. But, the lead opening 56 may be additionally or alternatively configured to receive the solder lead 22 of the antenna 12 with an interference-fit connection to hold the solder lead 22 within the lead opening 56. In the illustrated embodiment, the snap-fit connection between the lead opening 56 and the solder lead 22 is provided by one or more snap ribs 70 that extend along at least a portion of the length of the lead opening 56. The snap ribs 70 are configured to deflect and/or deform as the solder lead 22 is inserted into the lead opening 56 through the side entrance 66. Once the solder lead 22 has cleared the snap ribs 70, the snap ribs 70 snap back to the undeflected and/or undeformed positions to hold the solder lead 22 within the lead opening 56. Although two are shown, the lead opening 56 may include any number of the snap ribs 70.

Optionally, the lead opening 56 of the base 48 is bent along the length of the lead opening 56, as is shown in the illustrated embodiment. Specifically, the path of the lead opening 56 through the base 48 includes segments 72 and 74 that are interconnected at a bend 76 of the lead opening 56. The segment 72 includes the end 64 of the lead opening 56, while the segment 74 includes the end 62. As will be described below, the segment 74 of the lead opening 56 is configured to receive a segment 89 (FIGS. 5-7) of the coil 26 (FIGS. 2 and 5-7) of the antenna 12 therein. The bend 76 may have any angle that enables the segment 74 of the lead opening 56 to hold a structure (e.g., the coil 26) of the antenna 12 that extends from the solder lead 22.

The lead opening 56 may have any shape that enables the antenna holder 14 to hold the solder lead 22 of the antenna 12 as described and/or illustrated herein. Optionally, the lead opening 56 includes a shape that is complementary with the shape of the solder lead 22 and/or another structure (e.g., the coil 56) of the antenna 12.

Referring now to FIG. 4, the antenna holder 14 includes the protrusion 44 that defines a portion of the detent 40 of the antenna holder 14 and the circuit board 16 (FIGS. 1, 2, and 8-10). Specifically, the protrusion 44 extends outward on the side 54 of the base 48 of the body 46. In the illustrated embodiment, the protrusion 44 has a partially spherical shape. But, the protrusion 44 may additionally or alternatively include any other shape, such as, but not limited to, a parallelepiped, a rectangular cross-sectional shape, an oval cross-sectional shape, a cylindrical (i.e., circular cross-sectional) shape, a triangular cross-sectional shape, a cross-sectional shape having more than four sides, and/or the like.

The body 46 of the antenna holder 14 includes the connection member 50. The connection member 50 extends from the base 48 and is configured to mechanically connect to the circuit board 16 to thereby mount the body 46 to the circuit board 16. In the illustrated embodiment, the connection member 50 is a spring clip. Specifically, the connection member 50 includes a spring arm 78 that extends outward from an edge 80 of the base 48. The spring arm 78 extends a length from the edge 80 of the base 48 to an end 82 of the spring arm 78. As can be seen in FIG. 4, the length of the spring arm 78 is curved such that the length of the spring arm 78 curves back toward the base 48 as the spring arm 78 extends from the edge 80 to the end 82. In other words, the spring arm 78 has a "U" shape in the illustrated embodiment.

The spring arm 78 is shown in FIG. 4 in the natural resting position of the spring arm 78. The end 82 of the spring arm 78 is resiliently deflectable in the direction of the arrow A from the natural resting position of the spring arm 78. The spring arm 78 defines a spring clip that is configured to clip to the circuit board 16 such that the spring arm 78 straddles an edge 32 (FIGS. 2 and 9) of the circuit board 16. The spring arm 78 includes an optional engagement platform 84 at which the spring arm 78 is configured to engage in physical contact with the circuit board 16 to mechanically connect the connection member 50 to the circuit board 16. Specifically, the spring arm 78 is configured to mechanically connect to the circuit board 16 by engaging in physical contact with the opposite side 30 (FIGS. 2 and 8-10) of the circuit board 16 such that the circuit board 16 is engaged in physical contact between the engagement platform 84 of the spring arm 78 and the side 54 of the base 48.

Although shown as being located at the end 82 of the spring arm 78, the engagement platform 84 may be additionally or alternatively be located at any other location along the length of the spring arm 78. In some embodiments, the spring arm 78 may include two or more engagement platforms 84 located at different locations along the length of the spring arm 78, or may include a single engagement platform 84 that extends along a greater portion of the length of the spring arm 78 as compared to the exemplary engagement platform 84 shown and described herein.

The connection member 50 is not limited to the illustrated embodiment of the spring arm 78. Rather, other arrangements, structures, geometry, and/or the like of connection member 50 that enable the connection member 50 to mount the body 46 to the circuit board 50 as shown and/or described herein (e.g., such that the base 48 holds the solder lead 22 within the lead hole 24 during a soldering operation) may be used in addition or alternative to the spring arm 78. Moreover, the spring arm 78 may have any other geometry that enable the connection member 50 to mount the body 46 to the circuit board 50 as shown and/or described herein.

Figure 5:
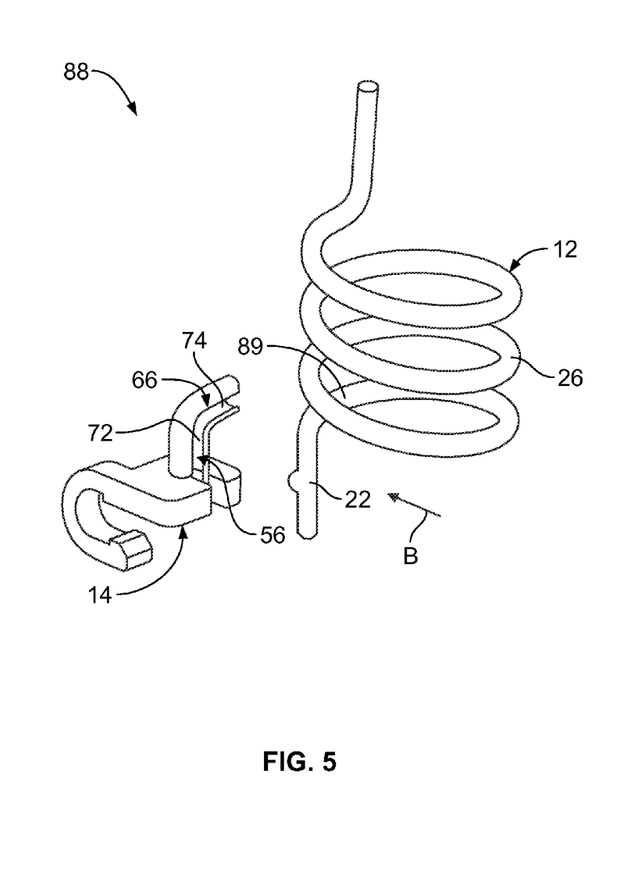
FIG. 5 is an exploded perspective view of an embodiment of an assembly of an embodiment of an antenna and the antenna holder shown in FIGS. 3 and 4.

FIG. 5 is an exploded perspective view of an assembly 88 of the antenna 12 and the antenna holder 14. The solder lead 22 of the antenna 12 is configured to be inserted into the lead opening 56 of the antenna holder 14 through the side entrance 66. Specifically, from the position relative to the antenna holder 14 shown in FIG. 5, the antenna 12 is configured to be moved relative to the antenna holder 14 in the direction of the arrow B such that the solder lead 22 of the antenna 12 is received into the segment 72 of the lead opening 56 of the antenna holder 14 through the side entrance 66 of the lead opening 56. In the illustrated embodiment, as the solder lead 22 is inserted into the lead opening 56 through the side entrance 66, the segment 89 of the coil 26 is received into the segment 74 of the lead opening 56 through the side entrance 66, as should be apparent from FIG. 5. The assembly 88 may be referred to herein as an "antenna assembly".

Figure 6:
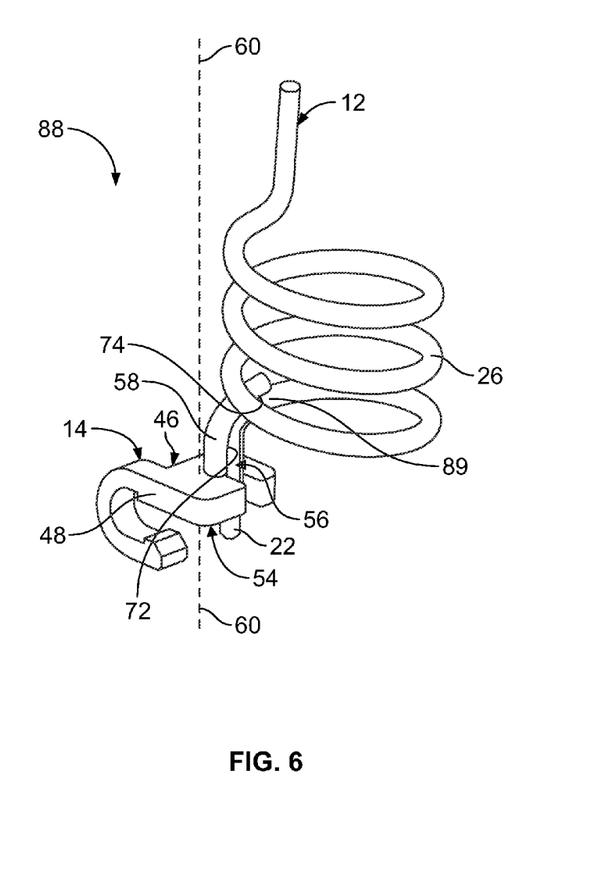
FIG. 6 is an unexploded perspective view of the assembly shown in FIG. 5.

FIG. 6 is an unexploded perspective view of the assembly 88 illustrating the antenna 12 as held by the antenna holder 14. As shown in FIG. 6, the solder lead 22 of the antenna 12 is held within the segment 72 of the lead opening 56 of the antenna holder 14. Optionally, the segment 89 of the coil 26 of the antenna 12 is held by the lead opening 56 of the antenna holder 14. Specifically, in the illustrated embodiment, the segment 89 of the coil 26 is held within the segment 74 of the lead opening 56. As should be apparent from FIG. 6, the portions of the body 46 of the antenna holder 14 through which the lead opening 56 extends supports the solder lead 22 of the antenna 12 along the axis 60. When included, a portion of the solder lead 22 extends within the tower 58 of the base 48 such that the tower 58 provides additional (i.e., in addition to the portion of the lead opening 56 that extends through the thickness $T_1$, shown in FIG. 3, of the base 48) support for the antenna 12 along the axis 60. In the illustrated embodiment, the portion of the body 46 that defines the segment 74 of the lead opening 56 supports the segment 89 of the coil 26 of the antenna 12. As can be seen in FIG. 6, an end 90 of the solder lead 22 is exposed from the body 46 of the antenna holder 14 along the side 54 of the base 48 when the solder lead 22 is held within the lead opening 56.

Figure 7:
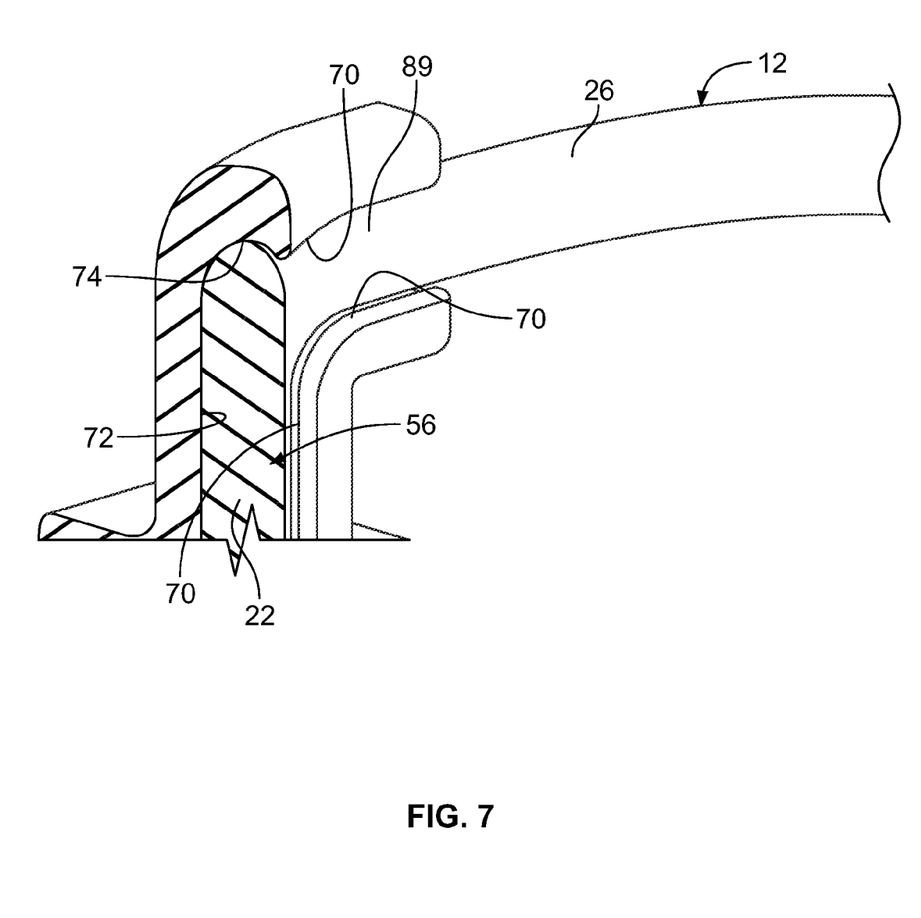
FIG. 7 is a perspective view of a portion of the assembly shown in FIGS. 5 and 6 illustrating a cross section of the assembly.

The solder lead 22 and the segment 89 of the antenna 12 are securely held by the base 48 within the lead opening 56 via the snap-fit connection between the segment 72 of the lead opening 56 and the solder lead 22 and between the segment 74 of the lead opening 56 and the segment 89 of the antenna coil 26. Specifically, and referring now to FIG. 7, the solder lead 22 of the antenna 12 is received into the segment 72 of the lead opening 56 such that the snap ribs 70 have snapped around the solder lead 22, as shown in FIG. 7. Similarly, the segment 89 of the coil 26 of the antenna 12 is received into the segment 74 of the lead opening 56 such that the snap ribs 70 have snapped around the segment 89. The solder lead 22 and the segment 89 of the antenna 12 are thereby securely held within the lead opening 56 of the antenna holder 14.

Referring again to FIG. 2, the antenna holder 14 is configured to hold the end 90 of the solder lead 22 of the antenna 12 within the lead hole 24 of the circuit board 16 during a soldering that is operation performed on the solder lead 22 (i.e., while the solder lead 22 is soldered to the circuit board 16). To solder the antenna 12 to the circuit board 16, the assembly 88 of the antenna 12 and the antenna holder 14 is mounted to the circuit board 16 by inserting the end 90 of the solder lead 22 into the lead hole 24 of the circuit board 16, for example by aligning the end 64 (FIGS. 2 and 3) of the lead opening 56 with the lead hole 24 of the circuit board 16. The end 90 of the solder lead 22 is inserted into the lead hole 24 with the assembly 88 in an orientation wherein the connection member 50 does not engage the circuit board 16, for example the orientation shown in FIG. 2.

Figure 8:
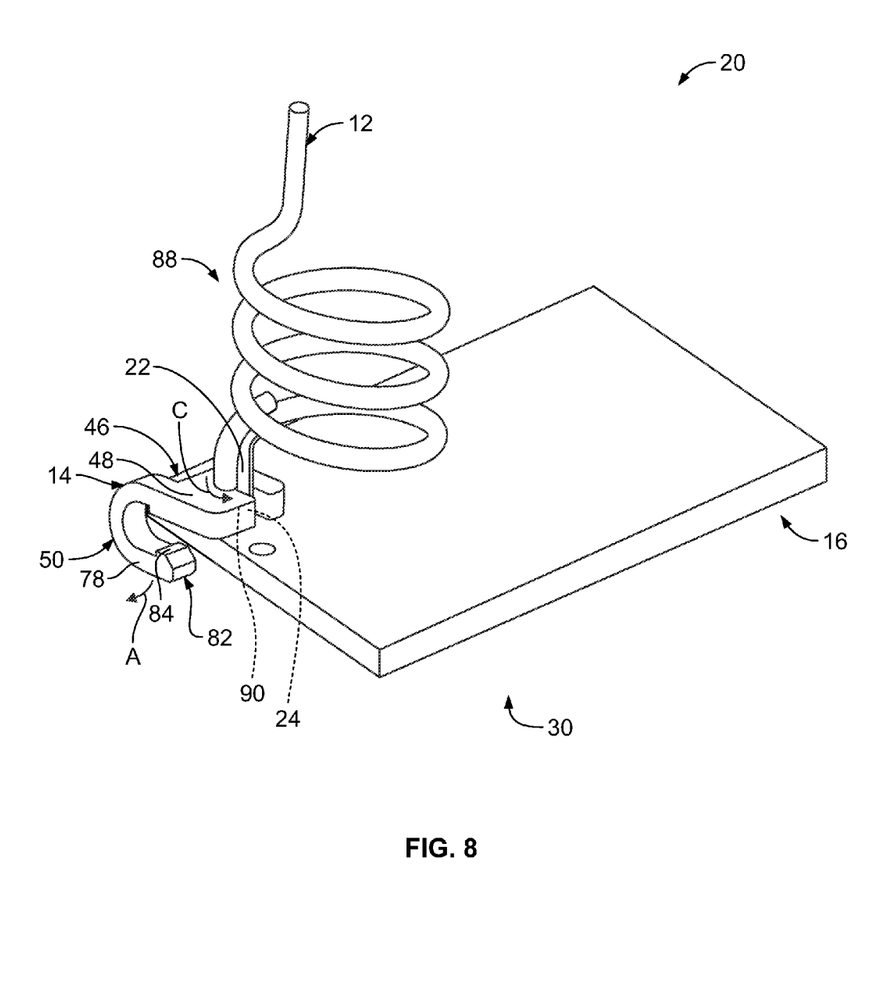
FIG. 8 is a another perspective view of the circuit board assembly shown in FIG. 2.

FIG. 8 is a perspective view of the circuit board assembly 20 illustrating the assembly 88 of the antenna 12 and the antenna holder 14 after the end 90 of the solder lead 22 has been received into the lead hole 24 of the circuit board 16. To mechanically connect the connection member 50 to the circuit board 16 and thereby mount the assembly 88 to the circuit board 16, the base 48 of the body 46 of the antenna holder 14 is rotated about the solder lead 22, and relative to the circuit board 16, in the direction of the arrow C. As the base 48 of the body 46 rotates relative to the circuit board 16 in the direction C, the engagement platform 84 of the spring arm 78 of the connection member 50 engages in physical contact with the opposite side 30 of the circuit board 16. The engagement between the spring arm 78 and the opposite side 30 of the circuit board 16 deflects the end 82 of the spring arm 78 in the direction A.

Figure 9:
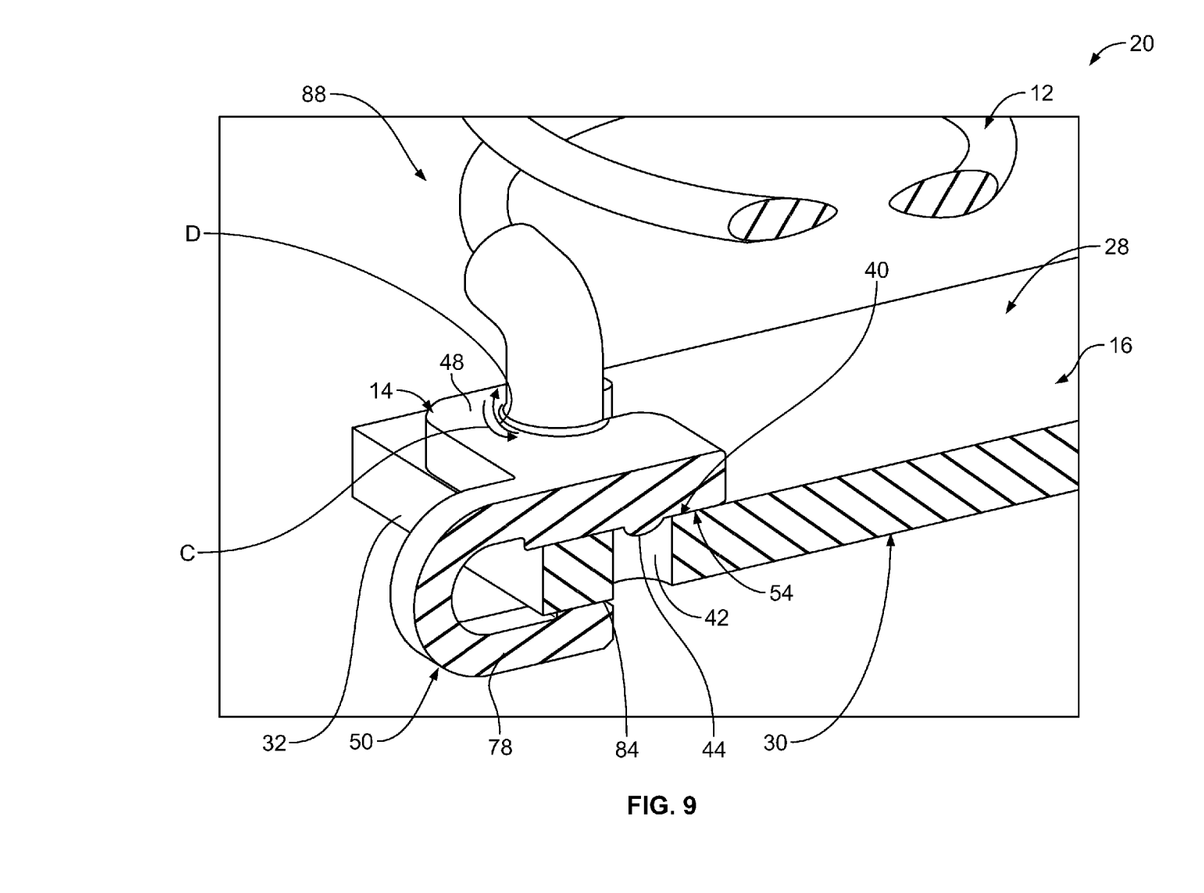
FIG. 9 is a perspective view of a portion of the circuit board assembly shown in FIGS. 2 and 8 illustrating a cross section of the assembly.

The base 48 of the antenna holder 14 is rotated in the direction C until the spring arm 78 of the connection member 50 is in the orientation relative to the circuit board 16 that is shown in FIGS. 1 and 9. The connection member 50 of the antenna holder 14 is mechanically connected to the circuit board 16 in the orientation shown in FIGS. 1 and 9. Specifically, and referring now solely to FIG. 9, the spring arm 78 of the connection member 50 is clipped to the circuit board 16 over the edge 32 of the circuit board 16. When clipped over the edge 32 of the circuit board 16 as shown in FIG. 9, the spring arm 78 straddles the edge 32 of the circuit board 16. As can be seen in FIG. 9, the engagement platform 84 of the spring arm 78 is engaged in physical contact with the opposite side 30 of the circuit board 16, and the side 54 of the base 48 is engaged in physical contact with the antenna side 28 of the circuit board 16. The resilience of the spring arm 78 that biases the spring arm 78 to the natural resting position shown in FIG. 4 exerts a force on the opposite side 30 of the circuit board 16 that presses the circuit board 16 against both the base 48 and the spring arm 78 of the antenna holder 14. The circuit board 16 is thus engaged in physical contact between the engagement platform 84 of the spring arm 78 and the side 54 of the base 48, which mechanically connects the connection member 50 to the circuit board 16 such that the assembly 88 of the antenna 12 and the antenna holder 14 is mounted to the circuit board 16.

As can be seen in FIG. 9, as the base 48 of the antenna holder 14 is rotated in the direction C, the protrusion 44 of the antenna holder 14 is received within the opening 42 of the circuit board 16. The detent 40 formed by the cooperation between the protrusion 44 and the opening 42 resists rotation of the antenna holder 14 relative to the circuit board 14. For example, reception of the protrusion 44 within the opening 42 resists rotation of the antenna holder 14 in the direction of the arrow D. The detent 40 may facilitate holding the antenna holder 14 in the orientation relative to the circuit board 16 that is shown in FIGS. 1 and 9.

Figure 10:
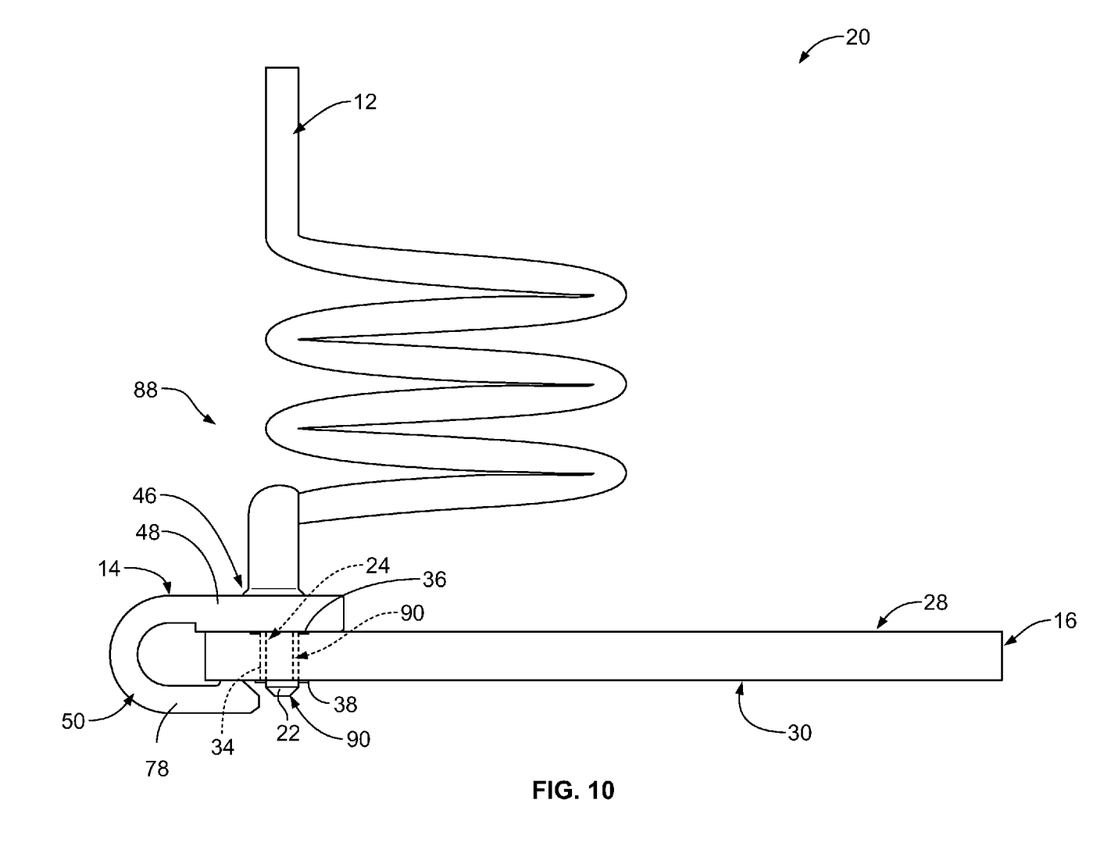
FIG. 10 is an elevational view of the circuit board assembly shown in FIGS. 2, 8, and 9 illustrating the assembly shown in FIGS. 5-7 mounted to an embodiment of a circuit board of the circuit board assembly.

When the assembly 88 of the antenna holder 14 and the antenna 12 is mounted to the circuit board 16 as shown in FIGS. 1 and 9, the mechanical connection between the connection member 50 and the circuit board 16 enables the base 48 of the antenna holder 14 to hold the end 90 (FIGS. 2, 8, and 10) of the solder lead 22 (FIGS. 1, 2, 5-8, and 10) of the antenna 12 within the lead hole 24 (FIGS. 2, 8, and 10) of the circuit board 16. For example, FIG. 10 is an elevational view of the circuit board assembly 20 illustrating the assembly 88 of the antenna holder 14 and the antenna 12 mounted to the circuit board 16. As shown in FIG. 10, the base 48 of the antenna holder 14 holds the end 90 of the solder lead 22 of the antenna 12 within the lead hole 24 of the circuit board 16 via the mechanical connection between the connection member 50 and the circuit board 16. The solder lead 22 can then be soldered to the circuit board 16 while the base 48 of the antenna holder 14 holds the end 90 of the solder lead 22 within the lead hole 24 of the circuit board 16.

For example, in the illustrated embodiment, the base 48 of the body 46 of the antenna holder 14 extends along the antenna side 28 of the circuit board 16, while the end 90 of the solder lead 22 is exposed along the opposite side 30 of the circuit board 16. Accordingly, the end 90 of the solder lead 22 is configured to be soldered to the circuit board 16 along the opposite side 30 of the circuit board 16 in the illustrated embodiment. If the electrically conductive material 34 is included, the end 90 of the solder lead 22 may be soldered to the electrically conductive material 34 of the lead hole 24 along the opposite side 30 of the circuit board 16. In addition or alternatively to being soldered to the electrically conductive material 34 along the opposite side 30 of the circuit board 16, the end 90 of the solder lead 22 may be soldered to the contact pad 38 that extends on the opposite side 30 of the circuit board 16 and/or to one or more other contact pads and/or other electrical contacts that extend on the opposite side 30. In some alternative embodiments, and in addition or alternatively to being soldered to the contact pad 38, to being soldered to one or more other contact pads and/or other electrical contacts that extend on the opposite side 30, and/or to being soldered along the opposite side 30 to the electrically conductive material 34, the end 90 of the solder lead 22 may soldered along the antenna side 28 to the electrically conductive material 34, may be soldered to one or more other contact pads and/or other electrical contacts that extend on the antenna side 28, and/or may be soldered to the contact pad 36 that extends on the antenna side 28 of the circuit board 16.

By holding the end 90 of the solder lead 22 within the lead hole 24 of the circuit board 16 while the end 90 is being soldered to the circuit board 16, the antenna holder 14 enables the soldering operation to be performed on the antenna 12 without requiring that an operator hold the solder lead 22 of the antenna within the lead hole 24 while the soldering operation is being performed. Specifically, the antenna holder 14 supports the antenna 12 and prevents the solder lead 22 of the antenna 12 from falling out of, and/or becoming misaligned within, the lead hole 24 of the circuit board. Accordingly, it may be less difficult and/or less time consuming to solder the antenna 12 to the circuit board 16 using the antenna holder 14, for example as compared to an operator holding the antenna 12 while the soldering operation is performed on the antenna 12. For example, the antenna holder 14 may enable a single operator to complete the soldering operation on the antenna 12. By lessening the difficulty and/or shortening the time required to solder the antenna 12 to the circuit board 12, the antenna holder 14 may reduce the manufacturing costs associated with the electrical device 10 (FIG. 1) and/or the circuit board assembly 20. Moreover, the reduced difficulty and/or production time provided by the antenna holder 14 may increase the number of electrical devices 10 and/or circuit board assemblies 20 that can be produced in a given amount of time.

Figure 11:
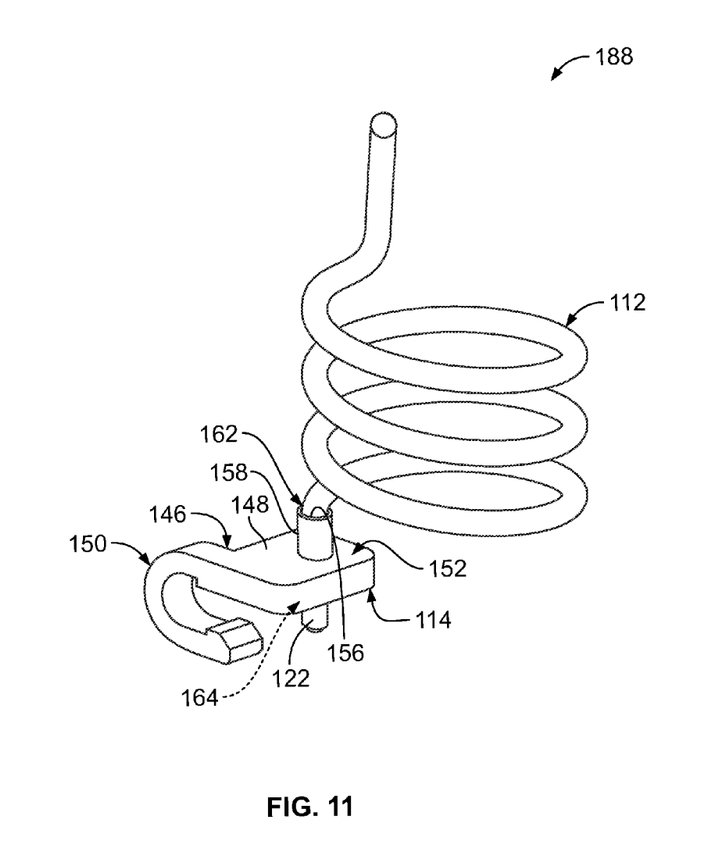
FIG. 11 is a perspective view of another embodiment of an assembly of another embodiment of a holder and another embodiment of an electrical component.

FIG. 11 is a perspective view of another embodiment of an assembly 188 of another embodiment of a holder 114 and another embodiment of an electrical component 112. In the illustrated embodiment, the electrical component 112 is an antenna. The electrical component 112 will be referred to herein as the "antenna 112", while the holder 114 will be referred to herein as the "antenna holder 114". The antenna holder 114 includes a body 146 having a base 148 and a connection member 150 that extends from the base 148. The base 148 is configured to hold the antenna 112, and the connection member 150 is configured to mount the body 146 to the circuit board 12 (FIGS. 1, 2, and 8-10). The geometry, structure, and operation of the connection member 150 is substantially similar to the connection member 50 (FIGS. 1-4 and 8-10) and therefore the geometry, structure, and operation of the connection member 150 will not be described herein.

The base 148 includes a lead opening 156 that extends through the base 148. The lead opening 156 is configured to hold a solder lead 122 of the antenna 112 therein. Optionally, the base 148 includes a tower 158 that extends outward from a side 152 of the base 148. The lead opening 156 extends through the tower 158 of the base 148. The lead opening 156 extends a length through the base 148 from an end 162 to an opposite end 164. The lead opening 156 is configured to receive the solder lead 122 of the antenna 112 therein through the end 162. The length of the lead opening 156 extends through the tower 158 of the base 148. In the illustrated embodiment, the lead opening 156 of the base 148 of the body 146 follows an approximately straight path through the body 146.

Figure 12:
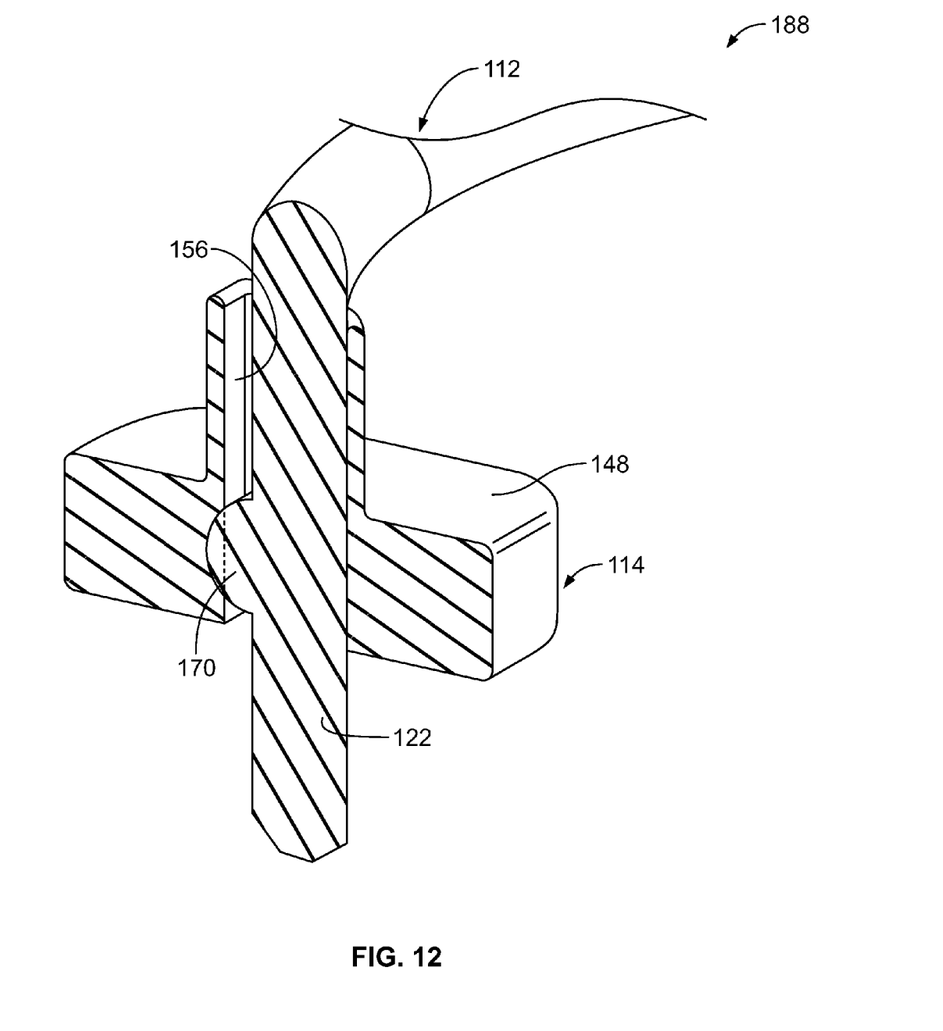
FIG. 12 is a perspective view of a portion of the assembly shown in FIG. 11 illustrating a cross section of the assembly.

In the illustrated embodiment, the lead opening 156 of the base 148 is configured to receive the solder lead 122 of the antenna 112 with an interference-fit connection to hold the solder lead 122 within the lead opening 156. But, the lead opening 156 may be additionally or alternatively configured to receive the solder lead 122 of the antenna 112 with a snap-fit connection to hold the solder lead 122 within the lead opening 156. FIG. 12 is a perspective view of a portion of the assembly 188 illustrating a cross section of the assembly 188 that illustrates an exemplary interference-fit between the solder lead 122 and the lead opening 156. In the illustrated embodiment, the interference-fit connection between the lead opening 156 and the solder lead 122 is provided by one or more protrusions 170 that extend outward on the solder lead 122. The protrusion 170 interferes with the interior wall(s) of the base 148 that defines the lead opening 156 to provide the interference-fit between the solder lead 122 and the lead opening 156. In addition or alternatively to the protrusion(s) 170 on the solder lead 122, the interior wall(s) of the base 148 that define the lead opening 156 may include one or more protrusions (not shown) that interfere with the solder lead 122 to provide the interference-fit. Although one is shown, the solder lead 122 may include any number of the protrusions 170.

Although shown and described as being an antenna, the electrical component 112 is not limited to being or including an antenna. Rather, in addition or alternatively to an antenna, the electrical component 112 may be, or include, any other type of electrical component that includes a solder lead (e.g., the solder lead 122) for soldering the electrical component 112 to a circuit board. Examples of other types of electrical components of the electrical component 112 include, but are not limited to, electrical connectors, electrical contacts, capacitors, memories, integrated circuits, processors, controllers, chips, single leaded connector pins, combined thru hole and surface mount components, and/or the like.

The embodiments described and/or illustrated herein provide a holder that may enable an electrical component to be soldered to a circuit board with less difficulty, for example as compared to at least some known electrical components and circuit boards. The embodiments described and/or illustrated herein provide a holder that may decrease manufacturing costs and/or increase production numbers.

It is to be understood that the above description and the figures are intended to be illustrative, and not restrictive. For example, the above-described and/or illustrated embodiments (and/or aspects thereof) may be used in combination with each other. In addition, many modifications may be made to adapt a particular situation or material to the teachings of the subject matter described and/or illustrated herein without departing from its scope. Dimensions, types of materials, orientations of the various components (including the terms "upper", "lower", "vertical", and "lateral"), and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description and the figures. The scope of the subject matter described and/or illustrated herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A holder for holding an electrical component on a circuit board having a lead hole, the holder comprising:
a body having a base for holding the electrical component and a connection member for mounting the body to the circuit board, the body composed of a dielectric material such that the base and the connection member are electrically insulative, the base including a top side and a bottom side, the bottom side configured to engage a first side of the circuit board, the base defining a lead opening extending through the base from the top side to the bottom side, the lead opening configured to receive a solder lead of the electrical component therein such that an end of the solder lead extends beyond the bottom side of the base and into the lead hole of the circuit board, the connection member extending from the base to a distal end of the connection member, the connection member being curved such that the distal end is disposed below the bottom side of the base and spaced apart from the bottom side, the connection member configured to extend around an edge of the circuit board such that a portion of the connection member at least proximate to the distal end engages an opposite second side of the circuit board to mechanically connect the body to the circuit board.

2. The holder of claim 1, wherein the base of the body is configured to hold the end of the solder lead of the electrical component within the lead hole of the circuit board during a soldering operation that solders the solder lead of the electrical component to the circuit board.

3. The holder of claim 1, wherein the base of the body comprises a tower that extends outward from the top side of the base, the lead opening of the base extending through the tower such that a portion of the solder lead extends within the tower.

4. The holder of claim 1, wherein the lead opening of the base of the body follows an approximately straight path through the base.

5. The holder of claim 1, wherein the lead opening of the base of the body extends a length through the base, the lead opening comprising a side entrance that extends the length of the lead opening, the lead opening being configured to receive the solder lead of the electrical component therein through the side entrance.

6. The holder of claim 1, wherein the lead opening of the base of the body is configured to receive the solder lead of the electrical component with at least one of an interference-fit connection or a snap-fit connection to hold the solder lead within the lead opening.

7. The holder of claim 1, wherein after the end of the solder lead extending through the lead opening of the base is received within the lead hole of the circuit board, the body is configured to be rotated relative to the circuit board about the solder lead for the portion of the connection member at least proximate to the distal end to engage the second side of the circuit board to mechanically connect the body to the circuit board.

8. The holder of claim 1, wherein the connection member comprises a u-shaped spring arm that is configured to straddle the edge of the circuit board.

9. The holder of claim 1, wherein the end of the solder lead of the electrical component is configured to be soldered to the circuit board along the second side of the circuit board that is opposite the first side engaged by the base.

10. An antenna assembly comprising:
an antenna that includes a solder lead extending to an end; and
an antenna holder for holding the antenna on a circuit board, the antenna holder comprising a body having a base for holding the antenna and a connection member for mounting the body to the circuit board, the base including a top side and a bottom side, the bottom side configured to engage a first side of the circuit board, the base defining a lead opening extending through the base from the top side to the bottom side, the lead opening receiving the solder lead of the antenna therein such that the end of the solder lead extends beyond the bottom side of the base and is received within a lead hole defined along the first side of the circuit board, the connection member extending from the base to a distal end of the connection member, the connection member being curved such that the distal end is disposed below the bottom side of the base and spaced apart from the bottom side, wherein the connection member is configured to extend around an edge of the circuit board such that a portion of the connection member at least proximate to the distal end engages an opposite second side of the circuit board to mechanically connect the body to the circuit board.

11. The antenna assembly of claim 10, wherein the lead opening of the base of the body of the antenna holder extends a length through the base, the lead opening comprising a side entrance that extends the length of the lead opening, the solder lead of the antenna being received within the lead opening of the antenna holder through the side entrance.

12. The antenna assembly of claim 10, wherein the lead opening of the base of the body of the antenna holder is configured to receive the solder lead of the antenna with at least one of an interference-fit connection or a snap-fit connection to hold the solder lead within the lead opening.

13. The antenna assembly of claim 10, wherein after the end of the solder lead extending through the lead opening of the base is received within the lead hole of the circuit board, the body of the antenna holder is configured to be rotated relative to the circuit board about the solder lead for the portion of the connection member at least proximate to the distal end to engage the second side of the circuit board to mechanically connect the body to the circuit board.

14. A circuit board assembly comprising:
a circuit board including a first side, an opposite second side, and an edge that extends from the first side to the second side, the circuit board defining a lead hole extending from the first side at least partially through the circuit board towards the second side;
an antenna comprising a solder lead having an end; and
an antenna holder comprising a body having a base for holding the antenna on the circuit board and a connection member for mounting the body to the circuit board, the base having a bottom side that engages the first side of the circuit board, the base defining a lead opening that receives the solder lead of the antenna therein, the lead opening of the base aligning with the lead hole of the circuit board, the solder lead extending through the base and into the lead hole of the circuit board, the connection member extending from the base to a distal end of the connection member, the connection member being curved such that the distal end is disposed below the bottom side of the base and spaced apart from the bottom side, wherein, after the solder lead extending through the lead opening of the base is received within the lead hole of the circuit board, the body is configured to be rotated relative to the circuit board about the solder lead for a portion of the connection member at least proximate to the distal end to engage the second side of the circuit board to mechanically connect the body to the circuit board, the base of the body moving along a plane that is parallel to the first side of the circuit board as the body is rotated about the solder lead.

15. The holder of claim 1, wherein the base includes a side edge that extends between the top side and the bottom side, the connection member extending laterally outward from the side edge of the base.

16. The holder of claim 1, wherein the body has a unitary, one-piece construction such that the connection member is integral to the base.

17. The circuit board assembly of claim 14, wherein the connection member extends laterally from the base along the first side of the circuit board and extends around the edge of the circuit board at a location that is spaced apart laterally relative to the base.

18. The circuit board assembly of claim 14, wherein the circuit board defines a detent opening along the first side of the circuit board, the base of the body including a protrusion extending from the bottom side of the base that engages the circuit board, the protrusion being received within the detent opening as the body is rotated relative to the circuit board to resist additional rotation of the body relative to the circuit board.

19. The holder of claim 1, wherein the lead opening of the base is sized to hold and support the solder lead in an upstanding position relative to the circuit board.

20. The antenna assembly of claim 13, wherein the base of the body moves along a plane that is parallel to the first side of the circuit board as the body is rotated about the solder lead.

* * * * *